(12) United States Patent
Chen et al.

(10) Patent No.: US 11,630,357 B2
(45) Date of Patent: Apr. 18, 2023

(54) DISPLAY DEVICE

(71) Applicant: InnoLux Corporation, Miao-Li County (TW)

(72) Inventors: Yi-Hsin Chen, Miao-Li County (TW); Ying-Jen Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/472,888

(22) Filed: Sep. 13, 2021

(65) Prior Publication Data

US 2022/0128875 A1 Apr. 28, 2022

(30) Foreign Application Priority Data

Oct. 26, 2020 (CN) .......................... 202011155098.X

(51) Int. Cl.
 *G02F 1/1362* (2006.01)
 *G02F 1/1368* (2006.01)

(52) U.S. Cl.
 CPC ...... *G02F 1/136286* (2013.01); *G02F 1/1368* (2013.01)

(58) Field of Classification Search
 CPC .................................................... G02F 1/1362
 See application file for complete search history.

(56) References Cited

U.S. PATENT DOCUMENTS

| 7,586,573 | B2 | 9/2009 | Yoshida et al. | |
| 2008/0204649 | A1* | 8/2008 | Yoshida | G02F 1/1393 |
| | | | | 349/141 |
| 2014/0160415 | A1* | 6/2014 | Peng | G02F 1/133753 |
| | | | | 349/139 |
| 2014/0267994 | A1* | 9/2014 | Ryu | G02F 1/137 |
| | | | | 349/141 |
| 2015/0015829 | A1* | 1/2015 | Chen | G02F 1/133707 |
| | | | | 349/96 |
| 2021/0080720 | A1* | 3/2021 | Zhao | G02B 27/0172 |

FOREIGN PATENT DOCUMENTS

| CN | 104570517 | * | 4/2015 | .......... G02F 1/1343 |
| TW | I225570 | B | 12/2004 | |

* cited by examiner

*Primary Examiner* — Sang V Nguyen
(74) *Attorney, Agent, or Firm* — McClure, Qualey & Rodack, LLP

(57) ABSTRACT

A display device is provided. The display device includes a first substrate, a second substrate, a patterned electrode, a switch unit, and a liquid-crystal layer doped with a chiral dopant. The second substrate is disposed corresponding to the first substrate, and the patterned electrode is disposed on the first substrate or the second substrate. The switch unit is disposed adjacent to the patterned electrode. The liquid-crystal layer doped with the chiral dopant is disposed between the first substrate and the second substrate. In addition, an edge of the patterned electrode that is closest to the switch unit has an open area and a closed area, wherein the open area is adjacent to the closed area, and the patterned electrode extends a connecting portion out from the closed area and the connecting portion is connected to the switch unit.

19 Claims, 12 Drawing Sheets

DISPLAY DEVICE

CROSS REFERENCE TO RELATED APPLICATIONS

This application claims the benefit of China Application No. 202011155098.X, filed Oct. 26, 2020, the entirety of which is incorporated by reference herein.

BACKGROUND

Technical Field

The present disclosure is related to a display device, and in particular it is related to a connection design between a patterned electrode and a switch unit of the display device.

Description of the Related Art

Electronic devices, such as smartphones, tablet computers, notebook computers, displays, and televisions, have become indispensable necessities in modern society. However, existing electronic devices (e.g., display devices) have not been entirely satisfactory in all aspects. For example, when the panel is scratched by an external force, an afterimage is likely to be generated at the scratched area, which increases the proportion of abnormal pixel display and thus affects the display quality.

Therefore, the development of a structural design that can further improve the quality or yield of electronic devices (such as display devices) is still currently an important research topic in the industry.

SUMMARY

In accordance with some embodiments of the present disclosure, a display device is provided. The display device includes a first substrate, a second substrate, a patterned electrode, a switch unit, and a liquid-crystal layer doped with a chiral dopant. The second substrate is disposed corresponding to the first substrate, and the patterned electrode is disposed on the first substrate or the second substrate. The switch unit is disposed adjacent to the patterned electrode. The liquid-crystal layer doped with the chiral dopant is disposed between the first substrate and the second substrate. In addition, an edge of the patterned electrode that is closest to the switch unit has an open area and a closed area, the open area is adjacent to the closed area, and the patterned electrode extends a connecting portion out from the closed area and the connecting portion is electrically connected to the switch unit.

In accordance with some embodiments of the present disclosure, a display device is provided. The display device includes a first substrate, a second substrate, a first patterned electrode, a first switch unit, and a liquid-crystal layer doped with a chiral dopant. The second substrate is disposed corresponding to the first substrate, and the first patterned electrode is disposed on the first substrate or the second substrate. The first switch unit is disposed adjacent to the first patterned electrode. The liquid-crystal layer doped with the chiral dopant is disposed between the first substrate and the second substrate. In addition, an edge of the first patterned electrode that is closest to the first switch unit has a first open area and a first closed area. The first open area is adjacent to the first closed area. The patterned electrode extends a connecting portion out from the first open area and the connecting portion is electrically connected to the first switch unit.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
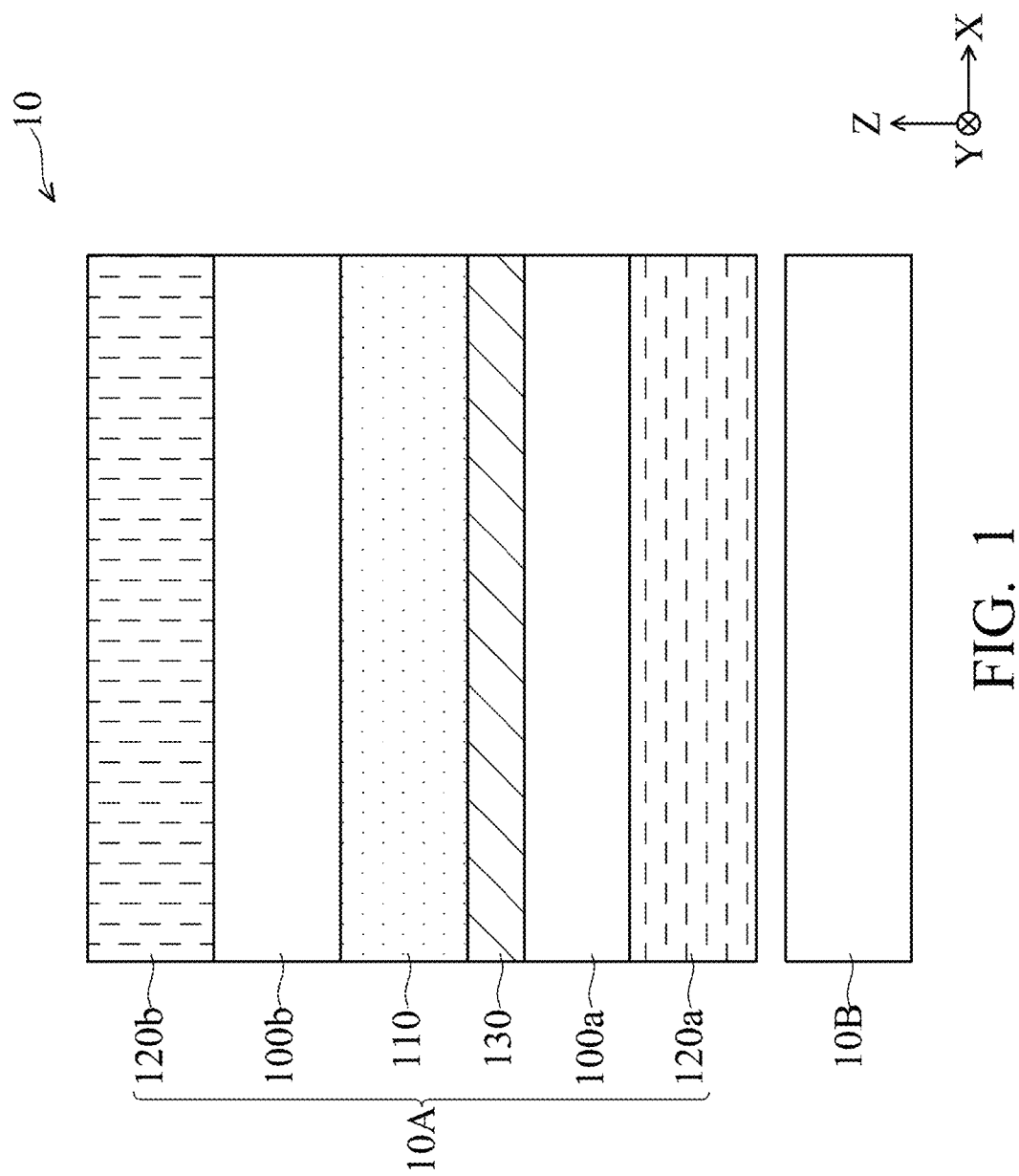
FIG. 1 is a cross-sectional diagram of a display device in accordance with some embodiments of the present disclosure.

The display device of the present disclosure is described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

The present disclosure can be understood by referring to the following detailed description in connection with the accompanying drawings. It should be noted that in order to make it easy for readers to understand and concise the drawings, only a part of the display device is drawn in some of the drawings of the present disclosure, and specific elements in the drawings may be not drawn to scale. In addition, the number and size of the element in the drawings are only for illustration, and are not intended to limit the scope of the present disclosure.

It should be understood that some of the elements or devices in the drawings of the present disclosure may be present in the form or configuration known to those skilled in the art. In addition, in the embodiments, relative expressions may be used. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. Moreover, the expressions such as "first material layer disposed on/over a second material layer", may indicate the direct contact of the first material layer and the second material layer, or it may indicate an indirect contact state with one or more intermediate layers between the first material layer and the second material layer. In the above situation, the first material layer may not be in direct contact with the second material layer.

Throughout the present disclosure and the appended claims, certain terms are used to refer to specific elements. Those skilled in the art should understand that electronic device manufacturers may refer to the same element with different names. The present disclosure does not intend to distinguish between elements that have the same function but different names. In the specification and claims, the terms "comprising", "including", "having" and the like are open-ended phrases, so they should be interpreted as "including but is not limited to . . . ". Therefore, when the terms "comprising", "including" and/or "having" are used in the description of the present disclosure, they specify the corresponding features, regions, steps, operations and/or components, but do not exclude the existence of one or more corresponding features, regions, steps, operations and/or components.

Directional terms mentioned in the present disclosure, such as "upper", "lower", "front", "rear", "left", "right", etc., are only the directions referring to the drawings. Therefore, the directional terms are used for illustration, not for limiting the present disclosure. In the drawings, each drawing depicts general features of methods, structures, and/or materials used in particular embodiments. However, these drawings should not be interpreted as defining or limiting the scope or properties encompassed by these embodiments. For example, for clarity, the relative sizes, thicknesses, and positions of the various layers, regions, and/or structures may be reduced or enlarged.

When a corresponding component (such as a layer or region) is referred to as "(disposed or located) on another component", it may be directly (disposed or located) on another component, or there may be other components between them. On the other hand, when a component is referred to as "directly (disposed or located) on another component", there is no component existing between them. In addition, when a component is referred to as "(disposed or located) on another component", the two have an upper-lower relationship from a top view, and this component may be above or below another component, and the upper-lower relationship depends on the orientation of the device.

In accordance with the embodiments of the present disclosure, regarding the terms such as "connected", "interconnected", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected" or "electrically coupled" may include any direct or indirect electrical connection means.

Furthermore, it should be understood that, although the terms "first", "second", "third" etc. may be used herein to describe various elements, components, regions, layers, or portions, these elements, components, or portions should not be limited by these terms. These terms are only used to distinguish one element, component, region, layer, or portion from another element, component, region, layer, or portion. Thus, a first element, component, region, layer, or portion discussed below could be termed a second element, component, region, layer, or portion without departing from the teachings of the present disclosure.

In the context, the terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The stated value of the present disclosure is an approximate value. When there is no specific description, the stated value includes the meaning of "about" or "substantially". In addition, the term "in a range from the first value to the second value" means that the range includes the first value, the second value, and other values in between.

It should be understood that in the following embodiments, without departing from the spirit of the disclosure, the features in several different embodiments can be replaced, recombined, and mixed to complete another embodiment. The features between the various embodiments can be mixed and matched arbitrarily as long as they do not violate or conflict the spirit of the present disclosure.

In accordance with the embodiments of the present disclosure, the thickness, length and the width of an element can be measured using an optical microscope, and the thickness of the element can be measured from a cross-sectional image obtained using an electron microscope, but it is not limited thereto. In addition, certain errors may exist between any two values or directions used for comparison. If the first value is equal to the second value, it may imply that there may be an 10% error between the first value and the second value; if the first direction is perpendicular to the second direction, the angle between the first direction and the second direction may be between 80 degrees and 100 degrees; and if the first direction is parallel to the second direction, the angle between the first direction and the second direction may be between −10 degrees and 10 degrees.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, a display device is provided. By adding a chiral dopant to the liquid-crystal layer and adjusting the connection position between the patterned electrode and the switch unit, the liquid-crystal alignment stability of the display device can be improved, or the issue of afterimage generated when the panel is scratched by an external force, which affects the display quality, can be reduced.

The embodiments of the present disclosure can be applied to various electronic devices, for example, a display device, a light-emitting device, a touch device, a sensing device, a tiled device, or a combination thereof, but it is not limited thereto. The electronic device may include a bendable or flexible electronic device. The electronic device may include, for example, a liquid-crystal device, but it is not limited thereto. In accordance with some embodiments, the electronic device may include a backlight module. The backlight module may include light-emitting diodes, such as inorganic light-emitting diodes, organic light-emitting diodes (OLEDs), mini light-emitting diodes (mini LEDs), micro light-emitting diodes (micro LEDs), quantum dot (QD) light-emitting diode (e.g., QLEDs or QDLEDs), fluorescence, phosphor, other suitable materials or a combination thereof, but it is not limited thereto. In addition, the electronic device may be rectangular, circular, polygonal, irregular, a shape with curved edges, or other suitable shapes. The electronic device may have peripheral systems such as a driving system, a control system, a light source system, or a shelf system to support a display device or an antenna device. In the following context, a display device will be used as an example to describe the electronic device, but the present disclosure is not limited thereto.

Refer to FIG. 1, which is a cross-sectional diagram of a display device 10 in accordance with some embodiments of the present disclosure. It should be understood that, for clear description, some elements of the display device 10 are omitted in the drawing, and only some elements are schematically shown. In accordance with some embodiments, additional features can be added to the display device 10 described below. In accordance with some other embodiments, some of the features of the display device 10 described below may be replaced or omitted.

As shown in FIG. 1, in some embodiments, the display device 10 may include a panel 10A and a backlight module 10B, and the panel 10A may be disposed on the backlight module 10B. In some embodiments, the panel 10A may include a substrate 100a, a substrate 100b, and a liquid-crystal layer 110. The substrate 100b may be disposed corresponding to the substrate 100a, and the liquid-crystal layer 110 may be disposed between the substrate 100a and the substrate 100b. In some embodiments, the substrate 100a may be the substrate that is closer to the backlight module 10B, and the substrate 100b may be the substrate that is farther from the backlight module 10B.

In accordance with the embodiments of the present disclosure, "the substrate 100a is disposed corresponding to the substrate 100b" means that the substrate 100a and the substrate 100b at least partially overlap in a normal direction of the substrate 100a (for example, the Z direction in the drawing).

The substrate 100a and the substrate 100b may include a flexible substrate, a rigid substrate, or a combination thereof. In some embodiments, the material of the substrate 100a and the substrate 100b may include glass, quartz, sapphire, ceramic, polyimide (PI), liquid-crystal polymer (LCP) material, polycarbonate (PC), photo sensitive polyimide (PSPI), polyethylene terephthalate (PET), other suitable materials or a combination thereof, but it is not limited thereto. Furthermore, the material of the substrate 100a may be the same as or different from the material of the substrate 100b.

In some embodiments, the liquid-crystal layer 110 may include liquid-crystal materials, other suitable modulating materials, or a combination thereof. In some embodiments, the liquid-crystal material may include nematic liquid crystal, smectic liquid crystal, cholesteric liquid crystal, blue phase liquid crystal, other suitable liquid-crystal materials, or a combination thereof, but it is not limited thereto. The display device 10 may include, but is not limited to, a twisted nematic (TN) type liquid-crystal device, a super twisted nematic (STN) type liquid-crystal device, and a double layer super twisted nematic (DSTN) type liquid-crystal device, a vertical alignment (VA) type liquid-crystal device, an in-plane switching (IPS) type liquid-crystal device, a cholesterol type liquid-crystal device, a blue phase type liquid-crystal device, a fringe field switching (FFS) type liquid-crystal device, a nano-protrusion vertical alignment (NPVA) type liquid-crystal device, other suitable liquid-crystal device, or a combination thereof.

In some embodiments, the liquid-crystal layer 110 may be doped with a chiral dopant, and the chiral dopant may include, for example, a left-handed chiral dopant or a right-handed chiral dopant. The chiral dopant can adjust the arrangement and/or rotation characteristics of the liquid-crystal molecules, and change the phase retardation. In some embodiments, the chiral dopant can be combined with the appropriate design of the liquid-crystal layer 110 and the optical element to improve the overall transmittance of the display device. The aforementioned optical element may be, for example, a polarizing plate, a compensation film, or the like. In some embodiments, an abnormal area can be defined as the area where the liquid-crystal molecules rotate less when an electronic device is applied with a voltage to form an electric field. More specifically, when the electronic device is applied with the voltage to form the electric field, the abnormal area can be defined as the area where an included angle between the optical axis of the liquid-crystal molecule and the absorption axis of one of the polarizers is small from a top view. In some embodiments, the abnormal area may be, for example, an area where dark bands are located. In some embodiments, the twist amount (d/p) of liquid-crystal molecules of the liquid-crystal layer 110 doped with the chiral dopant may be greater than or equal to 0.05 and less than or equal to 0.8 ($0.05 \leq d/p \leq 0.8$), or may be greater than or equal to 0.15 and less than or equal to 0.4 ($0.15 \leq d/p \leq 0.4$). In one embodiment, the twist amount of liquid-crystal molecules of the liquid-crystal layer 110 doped with the chiral dopant may be greater than or equal to 0.15 and less than or equal to 0.2 ($0.15 \leq d/p \leq 0.2$). In another embodiment, the twist amount of liquid-crystal molecules of the liquid-crystal layer 110 doped with the chiral dopant may be greater than or equal to 0.365 and less than or equal to 0.7 ($0.365 \leq d/p \leq 0.7$). The above-mentioned twist amount of liquid-crystal molecules may be defined as a ratio of the thickness (d) of the liquid-crystal layer 110 to the pitch (p) of the chiral dopant. The unit of the thickness of the liquid-crystal layer 100 and the unit of the pitch of the chiral dopant may be micrometers, or centimeters, and the present disclosure is not limited thereto.

Furthermore, in some embodiments, the panel 10A may include a polarizing plate 120a and a polarizing plate 120b. In some embodiments, the polarizing plate 120a may be disposed on the substrate 100a, the polarizing plate 120b may be disposed on the substrate 100b, and the polarizing plate 120a and the polarizing plate 120b may be disposed on the outside of the substrate 100a and the substrate 100b, respectively. As shown in FIG. 1, in some embodiments, the polarizing plate 120a may be disposed adjacent to the backlight module 10B, and the polarizing plate 120a may be disposed between the backlight module 10B and the substrate 100a.

In some embodiments, the polarizing plate 120a and the polarizing plate 120b may include a polyvinyl alcohol (PVA) film, a tri-acetyl cellulose (TAC) film, and a pressure sensitive adhesive film, a protective film, a release film, other suitable polarizing materials, or a combination thereof, but it is not limited thereto.

In addition, the panel 10A may include a patterned electrode 130, and the patterned electrode 130 may be disposed on the substrate 100a or the substrate 100b. As shown in FIG. 1, in some embodiments, the substrate 100a may be closer to the backlight module 10B than the substrate 100b, and the patterned electrode 130 may be disposed between the substrate 100a and the liquid-crystal layer 110. That is, the patterned electrode 130 may be disposed on the substrate 100a. However, in some other embodiments, the substrate 100a may be closer to the backlight module 10B than the substrate 100b, and the patterned electrode 130 may be disposed between the substrate 100b and the liquid-crystal layer 110. That is, the patterned electrode 130 may be disposed on the substrate 100b. In some embodiments, the patterned electrode 130 may be a pixel electrode, and/or a common electrode. In other words, if the patterned electrode 130 is a pixel electrode, the pixel electrode is disposed on the substrate 100a. In some embodiments, the patterned electrode 130 may be patterned to have a plurality of openings. The configuration and aspect of the patterned electrode 130 will be described in detail below.

In some embodiments, the patterned electrode 130 may include a metal conductive material, a transparent conductive material, other suitable materials, or a combination thereof, but it is not limited thereto. The metal conductive material may include copper (Cu), silver (Ag), tin (Sn), aluminum (Al), molybdenum (Mo), tungsten (W), gold (Au), chromium (Cr), nickel (Ni), platinum (Pt), titanium (Ti), alloys of any of the foregoing metals, other suitable materials, or a combination thereof, but it is not limited thereto. The transparent conductive material may include indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), other suitable materials, or a combination thereof, but it is not limited thereto.

It should be understood that another electrode layer of the electronic device is not illustrated in the drawings. In some embodiments, another electrode layer and the patterned electrode 130 may be disposed on either side of the liquid-crystal layer 110 respectively, and another electrode layer may be not patterned. In some embodiments, the aforementioned another electrode layer may be a common electrode. Furthermore, although not illustrated in FIG. 1, the panel 10A may further include an alignment layer, a driving circuit layer, a color filter layer, a light-shielding layer, or a spacer layer in accordance with some embodiments. In some embodiments, the driving circuit layer may, for example, include an active driving circuit and/or a passive driving circuit. In some embodiments, the driving circuit may include transistors (e.g., switching transistors or driving transistors, etc.), data lines, scan lines, conductive pads, dielectric layers or other circuits, etc., but is not limited thereto. In some other embodiments, the color filter layer may be disposed on the substrate 100a. That is, the display device 10 may be a display device with a COA (color filter on array) structure, and the substrate 100b may not include a color filter layer.

Figure 2A:
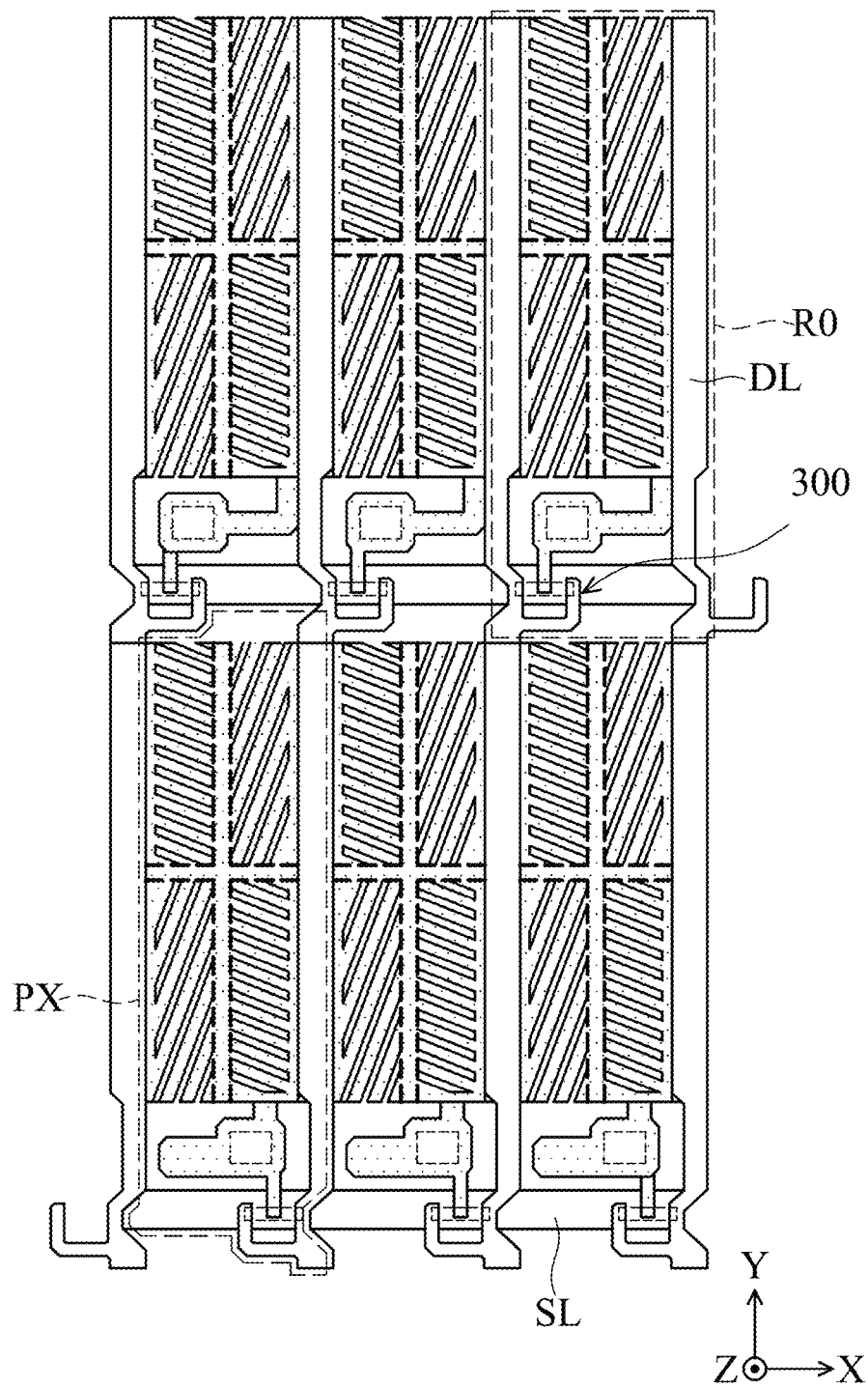
FIG. 2A is a partial top-view diagram of a display device in accordance with some embodiments of the present disclosure.
Figure 2B:
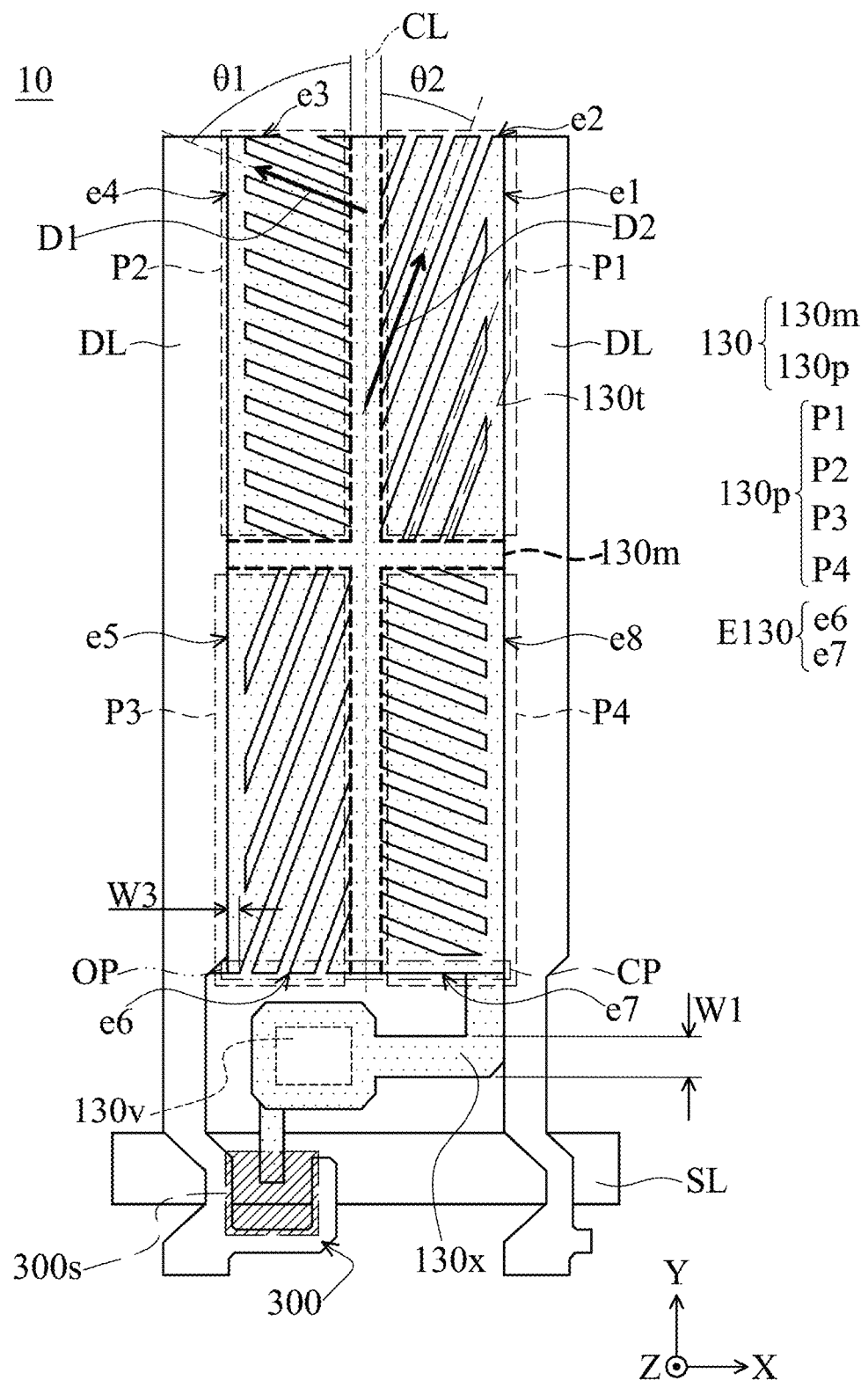
FIG. 2B is an enlarged diagram of region RO in FIG. 2A in accordance with some embodiments of the present disclosure.

Next, refer to FIG. 2A and FIG. 2B. FIG. 2A is a partial top-view diagram of the display device 10 in accordance with some embodiments of the present disclosure. Specifically, FIG. 2A shows the arrangement relationship between the patterned electrode 130 and the adjacent driving element. FIG. 2B is an enlarged diagram of region RO in FIG. 2A in accordance with some embodiments of the present disclosure.

As shown in FIG. 2A, in some embodiments, the display device 10 may include a plurality of data lines DL and a plurality of scan lines SL. The data lines DL and scan lines SL may be disposed on the substrate 100a or the substrate 100b (referring to FIG. 1). The data lines DL and the scan lines SL may intersect each other to define a plurality of pixel units PX., and each pixel unit PX may have a switch unit 300. Referring to FIG. 2B, the switch unit 300 may be disposed adjacent to the patterned electrode 130. The switch unit 300 may be electrically connected to the patterned electrode 130. Specifically, the display device 10 may include an electrode via 130v. The electrode via 130v may be disposed adjacent to the patterned electrode 130. The switch unit 300 may be electrically connected to the patterned electrode 130 through the electrode via 130v.

In some embodiments, the switch unit 300 may include a thin-film transistor (TFT), but it is not limited thereto. In addition, the thin-film transistor may be a top gate thin-film transistor, a bottom gate thin-film transistor, or a dual gate or double gate thin-film transistor. As shown in FIG. 2B, in some embodiments, the switch unit 300 may include at least one semiconductor layer 300s, a gate electrode (not illustrated, such as a part of the scan line SL), a source electrode, and a drain electrode (not illustrated). In the normal direction of the substrate 100a (for example, the Z direction in the drawing), the source electrode, the drain electrode, and the gate electrode may at least partially overlap the semiconductor layer 300s. In some embodiments, the patterned electrode 130 may be electrically connected to the drain electrode or the source electrode of the switch unit 300 through the electrode via 130v.

In some embodiments, the semiconductor layer 300s may include amorphous silicon, such as low-temperature polysilicon (LTPS), metal oxide, other suitable materials, or a combination thereof, but it is not limited thereto. The metal oxide may include indium gallium zinc oxide (IGZO), indium zinc oxide (IZO), indium gallium zinc tin oxide (IGZTO), other suitable metal oxide materials, or a combination thereof, but it is not limited thereto. In some embodiments, different thin-film transistors may have the aforementioned different semiconductor materials.

Furthermore, as shown in FIG. 2B, in some embodiments, the patterned electrode 130 may have a main portion 130m and sub-portions 130p. In some embodiments, the sub-portions 130p may include a sub-portion P1, a sub-portion P2, a sub-portion P3, and a sub-portion P4. Specifically, the main portion 130m may divide the patterned electrode 130 into the sub-portion P1, the sub-portion P2, the sub-portion P3, and the sub-portion P4, and the sub-portion P1, the sub-portion P2, the sub-portion P3, and the sub-portion P4 may be arranged in a counterclockwise manner. As shown in FIG. 2B, the sub-portion P2 and the sub-portion P4 may be adjacent to the sub-portion P1, and the sub-portion P3 and the sub-portion P1 may be arranged substantially diagonally. In some embodiments, the main portion 130m may have a cross shape, but it is not limited to this. In some other embodiments, the main portion 130m may have a free shape.

Furthermore, in some embodiments, the sub-portion P1, the sub-portion P2, the sub-portion P3, and the sub-portion P4 of the patterned electrode 130 may each include a plurality of branch portions 130t. In some embodiments, the branch portions 130t may be connected to the main portion 130m and extend in a direction away from the main portion 130m, but it is not limited thereto. In some embodiments, the extending directions of the branch portions 130t located in the same sub-portion 130p may be substantially the same. For example, the plurality of branch portions 130t in the sub-portion P2 substantially extend in an extending direction D1. The extending direction D1 may be a direction in which a center line CL of the main portion 130m rotates counterclockwise by an angle (for example, a first included angle θ1). In some embodiments, referring to FIG. 1 and FIG. 2B, the first included angle θ1 also may be the included angle between the branch portion 130t in the sub-portion P2 is and the main portion 130m. Under the condition that the liquid-crystal layer 110 is doped with the left-handed chiral dopant, and the absorption axis of the polarizing plate 120a is substantially perpendicular to the absorption axis of the polarizing plate 120b, the aforementioned first included angle θ1 may be greater than or equal to 20 degrees and less than or equal to 90 degrees (20 degrees≤θ1≤90 degrees). In some other examples, the plurality of branch portions 130t in the sub-portion P1 extend substantially in an extending direction D2. The extending direction D2 may be a direction in which the center line CL of the main portion 130m rotates clockwise by an angle (for example, a second included angle θ2). In some embodiments, referring to FIG. 1 and FIG. 2B, the second included angle θ2 also may be the included angle between the branch portion 130t in the sub-portion P1 and the main portion 130m. Under the condition that the liquid-crystal layer 110 is doped with the left-handed chiral dopant, and the absorption axis of the polarizing plate 120a is substantially perpendicular to the absorption axis of the polarizing plate 120b, the aforementioned second included angle θ2 may be greater than or equal to 5 degrees and less than or equal to 60 degrees (5 degrees≤θ2≤60 degrees). In one embodiment, under the condition that the liquid-crystal layer 110 is doped with the left-handed chiral dopant, and the absorption axis of the polarizing plate 120a is substantially perpendicular to the absorption axis of the polarizing plate 120b, the first included angle θ1 may be substantially equal to 70 degrees, and the second included angle θ2 may be substantially equal to 20 degrees.

In addition, in some embodiments, the first included angle θ1 may be not equal to the second included angle θ2. In some embodiments, there may be a third included angle (not illustrated) between the branch portion 130t and the main portion 130m in the sub-portion P3, and a fourth included angle (not illustrated) between the branch portion 130t and the main portion 130m in the sub-portion P4. In some embodiments, the third included angle may be not equal to the fourth included angle. In addition, the definitions of the third included angle and the fourth included angle are similar to that of the first included angle θ1 and the second included angle θ2, and thus will not be repeated herein.

In some embodiments, the edges of the sub-portion P1, the sub-portion P2, the sub-portion P3, and the sub-portion P4 that are arranged counterclockwise are sequentially defined as a first edge e1, a second edge e2, a third edge e3, a fourth edge e4, a fifth edge e5, a sixth edge e6, a seventh edge e7, and an eighth edge e8. The first edge e1, the second edge e2, the third edge e3, the fourth edge e4, the fifth edge e5, the sixth edge e6, the seventh edge e7, and the eighth edge e8 are also arranged in a counterclockwise manner.

It should be noted that, as shown in FIG. 2B, in some embodiments, an edge E130 of the patterned electrode 130 that is closest to the switch unit 300 (i.e. the sixth edge e6 and the seventh edge e7) may have an open area OP and a closed area CP, the open area OP may be adjacent to the closed area CP, and the patterned electrode 130 may extend a connecting portion 130x out from the closed area CP and the connecting portion 130x may be electrically connected to the switch unit 300 through the electrode via 130v. In some embodiments, the open area OP and the closed area CP may be located on either side of the center line CL of the main portion 130m respectively. In some embodiments, the open area OP may be defined as an area where the sixth edge e6 extends a distance along the positive Y direction and the negative Y direction respectively, and this distance may be substantially equal to 5 micrometers. Similarly, the closed area CP may be defined as an area where the seventh edge e7 extends a distance along the positive Y direction and the negative Y direction respectively, and this distance may be substantially equal to 5 micrometers. In other words, the open area OP may substantially correspond to the aforementioned sixth edge e6, and the closed area CP may substantially correspond to the aforementioned seventh edge e7. In some embodiments, the connecting portion 130x may be a junction connecting the patterned electrode 130 and the switch unit 300, and the material of the connecting portion 130x may be the same as that of the patterned electrode 130, but it is not limited thereto.

As shown in FIG. 2B, in some embodiments, the second edge e2 of the sub-portion P1 or the third edge e3 of the sub-portion P2 may also have an open area OP, but it is not limited thereto. In some embodiments, the patterned electrode 130 provided with the open area OP may improve the alignment stability of the liquid crystal.

Furthermore, in some embodiments, the connecting portion 130x may extend from any position of the closed area CP (the seventh edge e7) toward the switch unit 300, and be electrically connected to the switch unit 300 through the electrode via 130v. In some embodiments, in the normal direction of the substrate 100a (for example, the Z direction in the drawing), part of at least one of the branch portions 130t may be located in the open area OP. In some embodiments, in the normal direction of the substrate 100a (for example, the Z direction in the drawing), part of at least one of the branch portions 130t may be located in the closed area CP.

In some embodiments, a portion of the connecting portion 130x in contact with the patterned electrode 130 may extend along a first direction, a portion of the connecting portion 130x in contact with the electrode via 130v may extend along a second direction, and the first direction may be different from the second direction. For example, the first direction may be substantially perpendicular to the second direction. In some embodiments, the first direction may be substantially parallel to the data line DL, and the second direction may be substantially parallel to the scan line SL.

In some embodiments, the connecting portion 130x may have a width W1, and the width W1 may be in a range from 1 micrometer (μm) to 12 micrometers (i.e. 1 μm≤W1≤12 μm), or in a range from 2 μm and 8 μm. For example, the width W1 may be substantially equal to 6 μm, but the present disclosure is not limited thereto. In some embodiments, the aforementioned width W1 refers to the minimum width of the connecting portion 130x in a direction that is perpendicular to its extending direction.

In addition, in accordance with the embodiments of the present disclosure, an optical microscopy (OM), a scanning electron microscope (SEM), a film thickness profiler (α-step), an ellipsometer or other suitable methods may be used to measure the width, length, thickness of each element or the distance between elements. Specifically, in some embodiments, a scanning electron microscope may be used to obtain any cross-sectional image including the elements to be measured, and the width, length, thickness of the elements or distance between the elements in the image can be measured.

It should be noted that, in accordance with the embodiments of the present disclosure, the connecting portion 130x connecting the patterned electrode 130 and the switch unit 300 can be disposed at the specific position of the patterned electrode 130 (for example, on the specific edge of the patterned electrode 130). The liquid crystal alignment stability of the display device 10 thereby can be improved, or the issue of afterimage generated when the panel 10A is scratched by an external force can be reduced.

Specifically, in some embodiments, when the liquid-crystal layer 110 is doped with the left-handed chiral dopant, and the patterned electrode 130 and the switch unit 300 are disposed on the substrate 100a, the connecting portion 130x connecting the patterned electrode 130 and the electrode via 130v may be disposed at any position on the odd-numbered edge (for example, the seventh edge e7) of the patterned electrode 130. In some other embodiments, when the liquid-crystal layer 110 is doped with the left-handed chiral dopant, and the patterned electrode 130 and the switch unit 300 are disposed on the substrate 100b, the connecting portion 130x connecting the patterned electrode 130 and the electrode via 130v may be disposed at any position on the even-numbered edge of the patterned electrode 130 (for example, the sixth edge e6).

In some embodiments, when the liquid-crystal layer 110 is doped with the right-handed chiral dopant, and the patterned electrode 130 and the switch unit 300 are disposed on the substrate 100a, the connecting portion 130x connecting the patterned electrode 130 and the electrode via 130v may be disposed at any position on the even-numbered edge (for example, the sixth edge e6) of the patterned electrode 130. In some other embodiments, when the liquid-crystal layer 110 is doped with the right-handed chiral dopant, and the patterned electrode 130 and the switch unit 300 are disposed on the substrate 100b, the connecting portion 130x connecting the patterned electrode 130 and the electrode via 130v may be disposed at any position on the odd-numbered edge (for example, the seventh edge e7) of the patterned electrode 130. In other words, when the liquid-crystal layer 110 is doped with the right-handed chiral dopant, and the patterned electrode 130 and the switch unit 300 are disposed on the substrate that is closer to the backlight module 10B, the connecting portion 130x may be disposed at any position on the even-numbered edge (for example, the sixth edge e6) of the patterned electrode 130. On the other hand, when the liquid-crystal layer 110 is doped with the right-handed chiral dopant, and the patterned electrode 130 and the switch unit 300 are disposed on the substrate that is farther from the backlight module 10B, the connecting portion 130x may be disposed at any position on the odd-numbered edge (for example, the seventh edge e7) of the patterned electrode 130.

Figure 3:
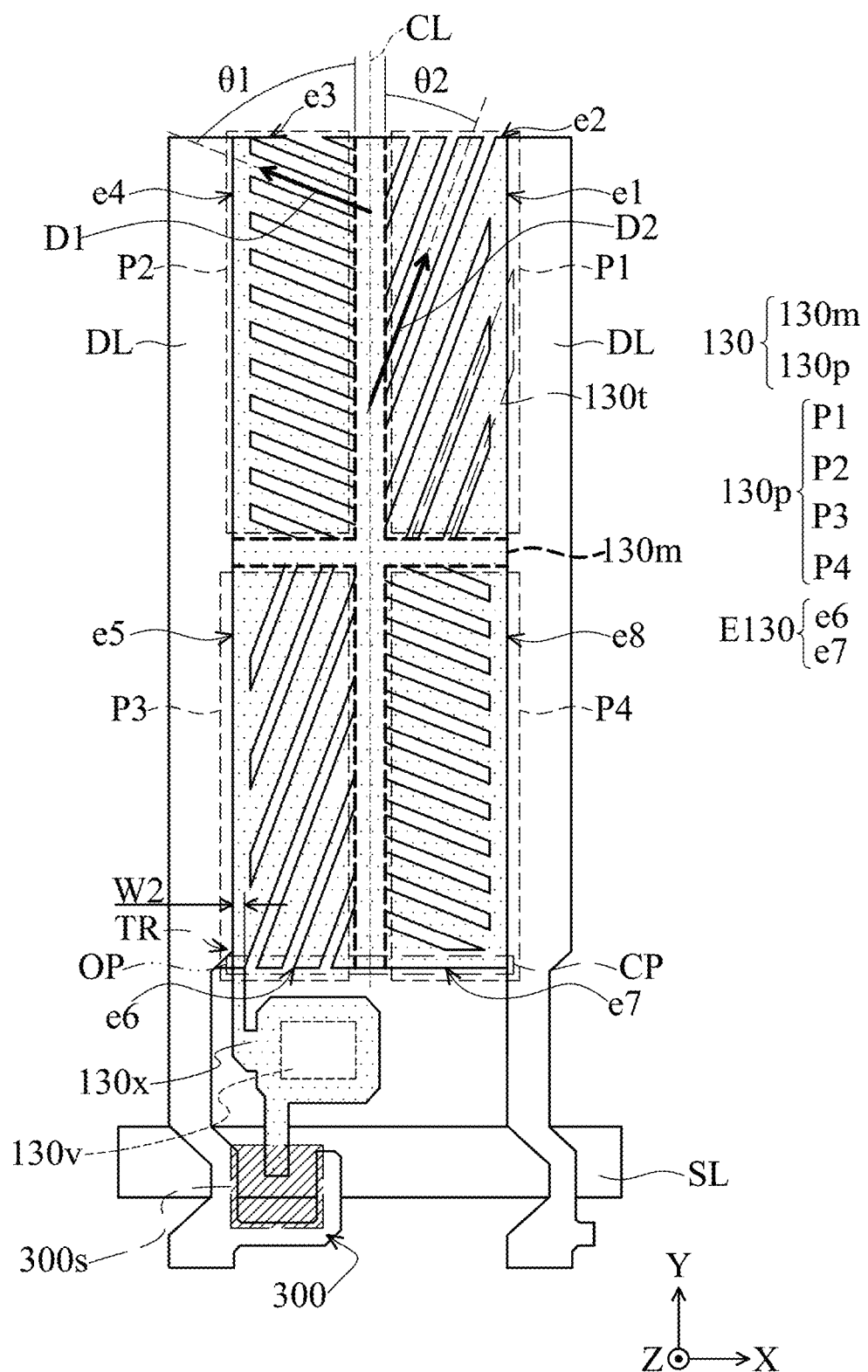
FIG. 3 is a partial top-view diagram of a display device in accordance with some embodiments of the present disclosure.

Next, refer to FIG. 3, which is a partial top-view diagram of the display device 10 in accordance with some other embodiments of the present disclosure. Specifically, FIG. 3 shows the arrangement relationship between the patterned electrode 130 and the adjacent driving element. It should be understood that the same or similar components (or elements) in the following paragraph will be denoted by the same or similar reference numbers, and their materials, manufacturing methods and functions are the same or similar to those described above, and thus they will not be repeated in the following context.

As shown in FIG. 3, in some embodiments, the connecting portion 130x connecting the patterned electrode 130 and the electrode via 130v may be disposed in the open area OP. Specifically, in some embodiments, the patterned electrode 130 may have a terminal portion TR, and the terminal portion TR may be located at a position in the open area OP that is farther from the closed area CP. In addition, the patterned electrode 130 may extend the connecting portion 130x out from the terminal portion TR and the connecting portion 130x is electrically connected to the switch unit 300 through the electrode via 130v. In some embodiments, the terminal portion TR may be a part of the branch portion 130t in the open area OP that is farthest from the closed area CP. In some embodiments, in the normal direction of the substrate 100a (for example, the Z direction in the drawing), the terminal portion TR may overlap an intersection point of the fifth edge e5 and the sixth edge e6. In some embodiments, the terminal portion TR can be regarded as the corner point of the sixth edge e6.

In some embodiments, the connecting portion 130x may extend from the terminal portion TR toward the electrode via 130v. In some embodiments, a portion of the connecting portion 130x in contact with the patterned electrode 130 may extend along the first direction, a portion of the connecting portion 130x in contact with the electrode via 130v may extend along the second direction, and the first direction may be different from the second direction. For example, the first direction may be substantially perpendicular to the second direction. In some embodiments, the first direction may be substantially parallel to the data line DL, and the second direction may be substantially parallel to the scan line SL.

In some embodiments, the terminal portion TR may have a width W2, and the width W2 may be greater than 0 μm and less than or equal to 8 μm (i.e. 0 μm<width W2≤8 μm), or greater than 0 μm and less than or equal to 4 μm. In some embodiments, the aforementioned width W2 may be the minimum width of the branch portion 130t in the second direction (for example, the X direction in the drawing). Furthermore, in some embodiments, the width W2 may be substantially the same as the width of the portion of the connecting portion 130x in contacting the patterned electrode 130. In some embodiments, the periphery of the patterned electrode 130 may have a width W3, and the width W3 may be greater than 0 μm and less than or equal to 12 μm (i.e. 0 μm<W3≤12 μm), or greater than 0 μm and less than or equal to 6 μm, for example, the width W3 may be substantially equal to 4 μm, but the present disclosure is not limited thereto.

It should be noted that, in accordance with the embodiments of the present disclosure, the connecting portion 130x connecting the patterned electrode 130 and the switch unit 300 can be disposed at the specific position of the patterned electrode 130 (for example, at the corner point of the specific edge of the patterned electrode 130). The liquid crystal alignment stability of the display device 10 thereby can be improved, or the issue of afterimage generated when the panel 10A is scratched by an external force can be reduced.

Specifically, in some embodiments, when the liquid-crystal layer 110 is doped with the left-handed chiral dopant, and the patterned electrode 130 and the switch unit 300 are disposed on the substrate 100a, the connecting portion 130x connecting the patterned electrode 130 and the electrode via 130v may be disposed at the corner point of the even-numbered edge (for example, the sixth edge e6) of the patterned electrode 130. In some other embodiments, when the liquid-crystal layer 110 is doped with the left-handed chiral dopant, and the patterned electrode 130 and the switch unit 300 are disposed on the substrate 100b, the connecting portion 130x connecting the patterned electrode 130 and the electrode via 130v may be disposed at the corner point of the odd-numbered edge (for example, the seventh edge e7) of the patterned electrode 130. In other words, when the liquid-crystal layer 110 is doped with the left-handed chiral dopant, and the patterned electrode 130 and the switch unit 300 are disposed on the substrate that is closer to the backlight module 10B, the connecting portion 130x may be disposed at the corner point of the even-numbered edge of the patterned electrode 130. When the liquid-crystal layer 110 is doped with the left-handed chiral dopant, and the patterned electrode 130 and the switch unit 300 are disposed on the substrate that is farther from the backlight module 10B, the connecting portion 130x may be disposed at the corner point of the odd-numbered edge of the patterned electrode 130.

In some embodiments, when the liquid-crystal layer 110 is doped with the right-handed chiral dopant, and the patterned electrode 130 and the switch unit 300 are disposed on the substrate 100a, the connecting portion 130x connecting the patterned electrode 130 and the electrode via 130v may be disposed at the corner point of the odd-numbered edge (for example, the seventh edge e7) of the patterned electrode 130. In some other embodiments, when the liquid-crystal layer 110 is doped with the right-handed chiral dopant, and the patterned electrode 130 and the switch unit 300 are disposed on the substrate 100b, the connecting portion 130x connecting the patterned electrode 130 and the electrode via 130v may be disposed at the corner point of the even-numbered edge (for example, the sixth edge e6) of the patterned electrode 130. In other words, when the liquid-crystal layer 110 is doped with the right-handed chiral dopant, and the patterned electrode 130 and the switch unit 300 are disposed on the substrate that is closer to the backlight module 10B, the connecting portion 130x may be disposed at the corner point of the odd-numbered edge of the patterned electrode 130. When the liquid-crystal layer 110 is doped with the right-handed chiral dopant, and the patterned electrode 130 and the switch unit 300 are disposed on the substrate that is farther from the backlight module 10B, the connecting portion 130x may be disposed at the corner point of the even-numbered edge of the patterned electrode 130.

Figure 4:
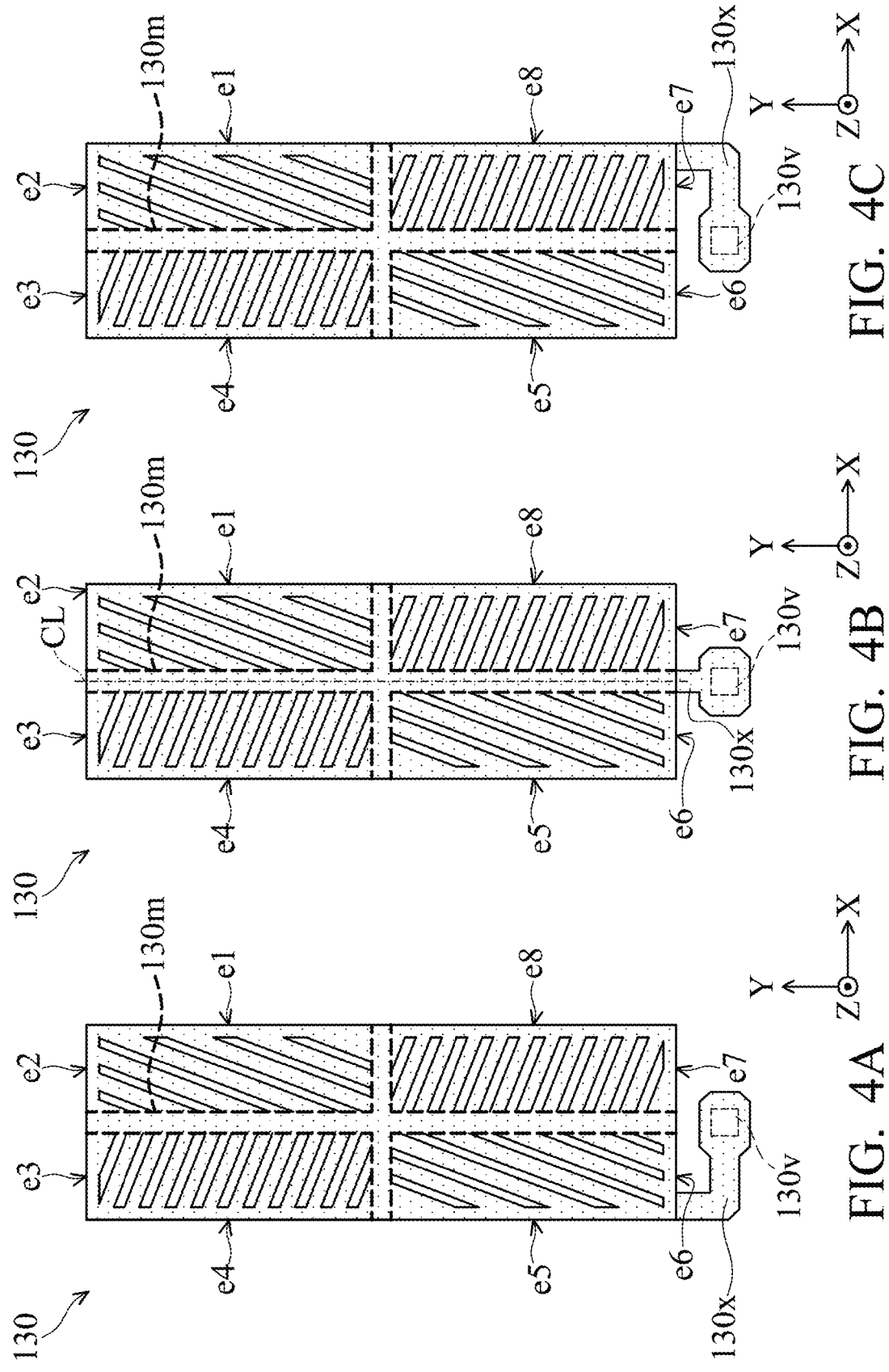
FIGS. 4A to 4C are partial top-view diagrams of a display device in accordance with some embodiments of the present disclosure.

Next, refer to FIGS. 4A to 4C, which are partial top-view diagrams of the display device 10 in accordance with some other embodiments of the present disclosure. It should be understood that, for clarity of description, FIGS. 4A to 4C only illustrate the patterned electrode 130, the connecting portion 130x, and the electrode via 130v, and other elements are omitted.

In some embodiments, all the edges of the four sub-portions of the patterned electrode 130 (i.e. the first edge e1, the second edge e2, the third edge e3, the fourth edge e4, the fifth edge e5, and the sixth edge e6, the seventh edge e7 and the eighth edge e8) may be closed (all of them have the closed areas), but the present disclosure is not limited thereto. In some embodiments, the edges of the four sub-portions of the patterned electrode 130 may be the same as the embodiments described above. That is, one side (e.g., the seventh edge e7) has the closed area, and one side (e.g., the sixth edge e6) has the open area. Furthermore, as shown in FIG. 4A, in some embodiments, the connecting portion 130x may be disposed on the closed sixth edge e6, for example, may be disposed at the corner point of the sixth edge e6. As shown in FIG. 4B, in some embodiments, the connecting portion 130x may be disposed on the boundary between the sixth edge e6 and the seventh edge e7, for example, the connecting portion 130x may be located on the extending direction of the main portion 130m. Furthermore, as shown in FIG. 4C, in some embodiments, the connecting portion 130x may be disposed on the seventh edge e7, for example, may be disposed at the corner point of the seventh edge e7.

Figure 5:
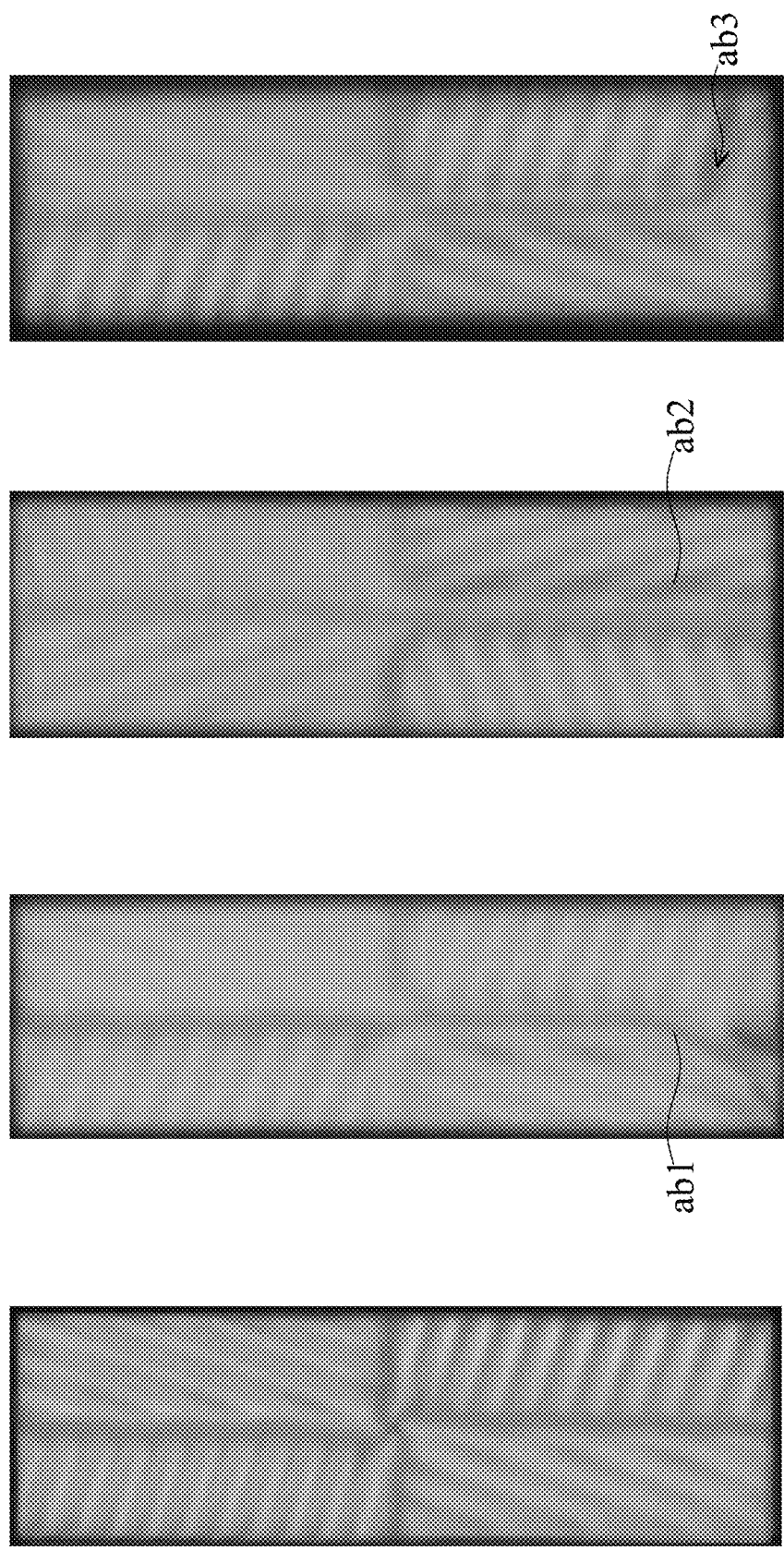
FIGS. 5A to 5D are top-view images of the patterned electrode of a display device in accordance with some embodiments of the present disclosure.

Refer to FIGS. 5A to 5D, which are top-view images of the patterned electrode 130 of the display device in accordance with some embodiments of the present disclosure. FIGS. 5A to 5D show the images of the patterned electrode 130 under the condition that the patterned electrode 130 is disposed on the substrate 100a and the liquid-crystal layer 110 is doped with the left-handed chiral dopant, but the present disclosure is not limited thereto. FIG. 5A shows the top-view image of the patterned electrode 130 when the patterned electrode 130 is not scratched by an external force. FIGS. 5B to 5D show the top-view images of the patterned electrode 130 after being scratched by an external force (for example, referring to FIG. 3, scratched substantially along the direction in which the center line CL of the main portion 130m extends). Furthermore, the images of the embodiments shown in FIGS. 5B to 5D correspond to the configuration of the connecting portion 130 shown FIGS. 4A to 4C, respectively. In addition, the images shown in FIGS. 5A to 5D were obtained by a microscope.

According to the results shown in FIGS. 4A to 4C and FIGS. 5B to 5D, it can be seen that after scratching by external force, the abnormal scratching areas (e.g., the position ab1, position ab2, and position ab3 indicated in the drawings, such as dark bands) are likely to extend toward the position of the connecting portion 130x. That is, the positions where the abnormal events occur substantially correspond to the position of the connecting portion 130x of the patterned electrode 130.

Next, refer to FIGS. 6A to 6C and FIGS. 7A to 7C, which are partial top-view diagrams of the display device 10 in accordance with some other embodiments of the present disclosure. It should be understood that, for clarity of description, FIGS. 6A to 6C and FIGS. 7A to 7C also only illustrate the patterned electrode 130, the connecting portion 130x, and the electrode via 130v, and other elements are omitted.

Figure 6:
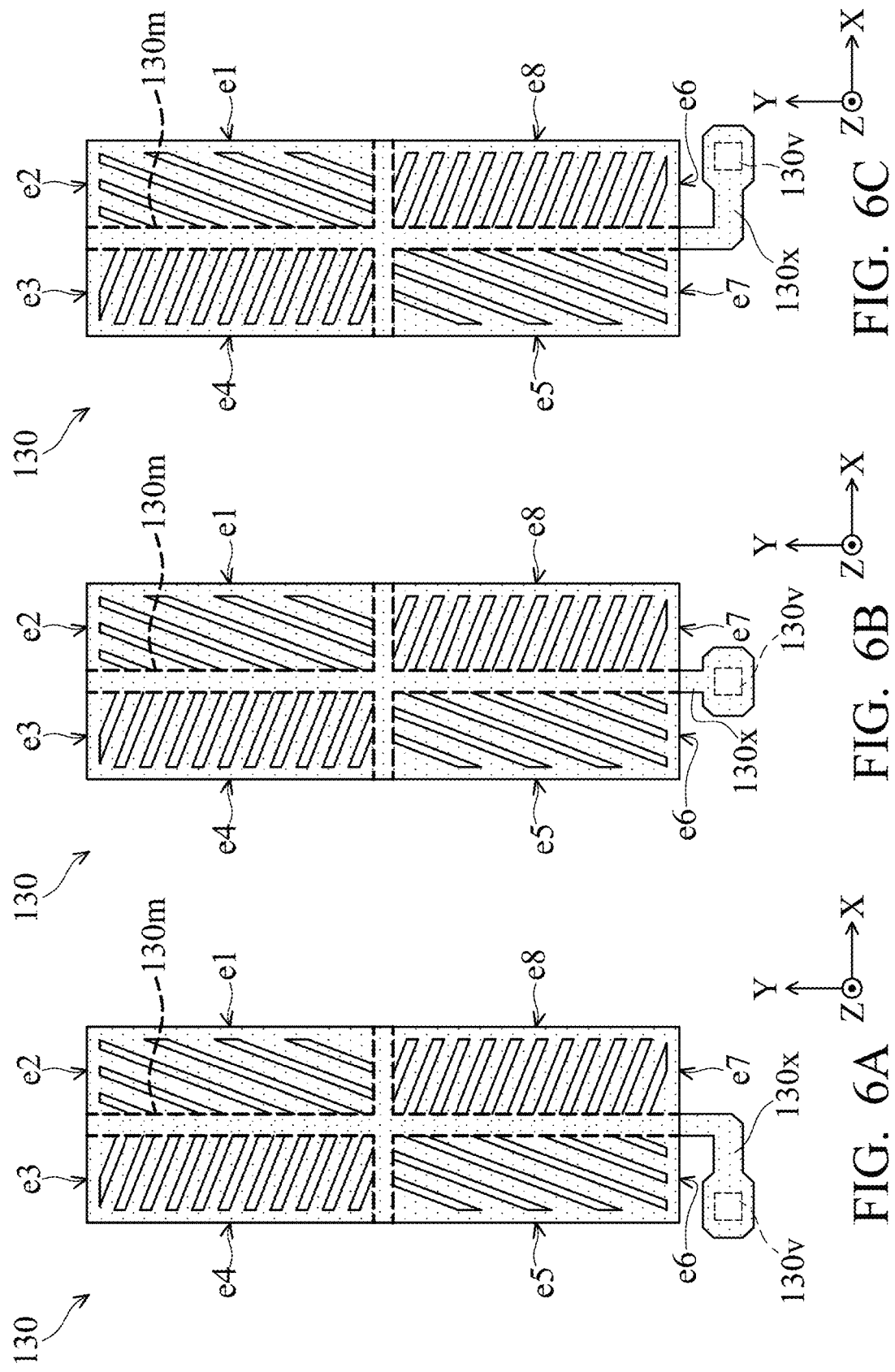
FIGS. 6A to 6C are partial top-view diagrams of a display device in accordance with some embodiments of the present disclosure.

As shown in FIGS. 6A to 6C, in some embodiments, the connecting portion 130x may be located on the extending direction of the main portion 130m, and the electrode via 130v may be disposed at the corner point adjacent to the sixth edge e6 (e.g., as shown in FIG. 6A), the electrode via 130v may be disposed adjacent to the boundary between the sixth edge e6 and the seventh edge e7 (e.g., as shown in FIG. 6B), or the electrode via 130v may be disposed at the corner point adjacent to the seventh edge e7 (e.g., as shown in FIG. 6C). The patterned electrode 130 may be electrically connected to the switch unit 300 through the electrode via 130v.

Figure 7:
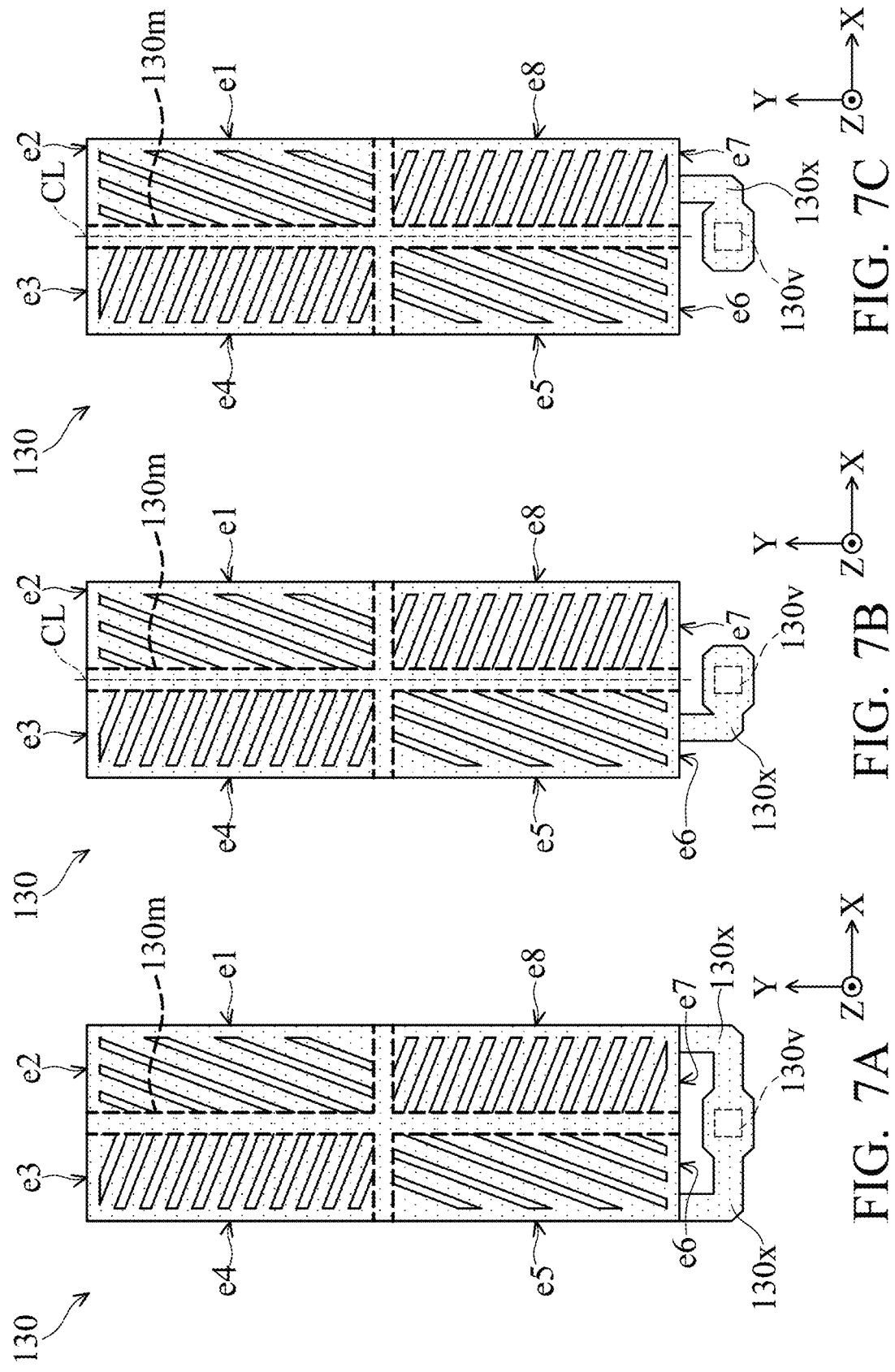
FIGS. 7A to 7C are partial top-view diagrams of a display device in accordance with some embodiments of the present disclosure.

Furthermore, as shown in FIGS. 7A to 7C, in some embodiments, the position of the electrode via 130v may be disposed adjacent to the boundary between the sixth edge e6 and the seventh edge e7, and the connecting portions 130x may be disposed at the corner point of the sixth edge e6 and the corner point of the seventh edge e7 simultaneously (e.g., as shown in FIG. 7A), the connecting portion 130x may be disposed between the corner point of the sixth edge e6 and the center line CL of the main portion 130m (e.g., as shown in FIG. 7B), or the connecting portion 130x may be disposed between the corner point of the seventh edge e7 and the center line CL of the main portion 130m (e.g., as shown in FIG. 7C).

Figure 8:
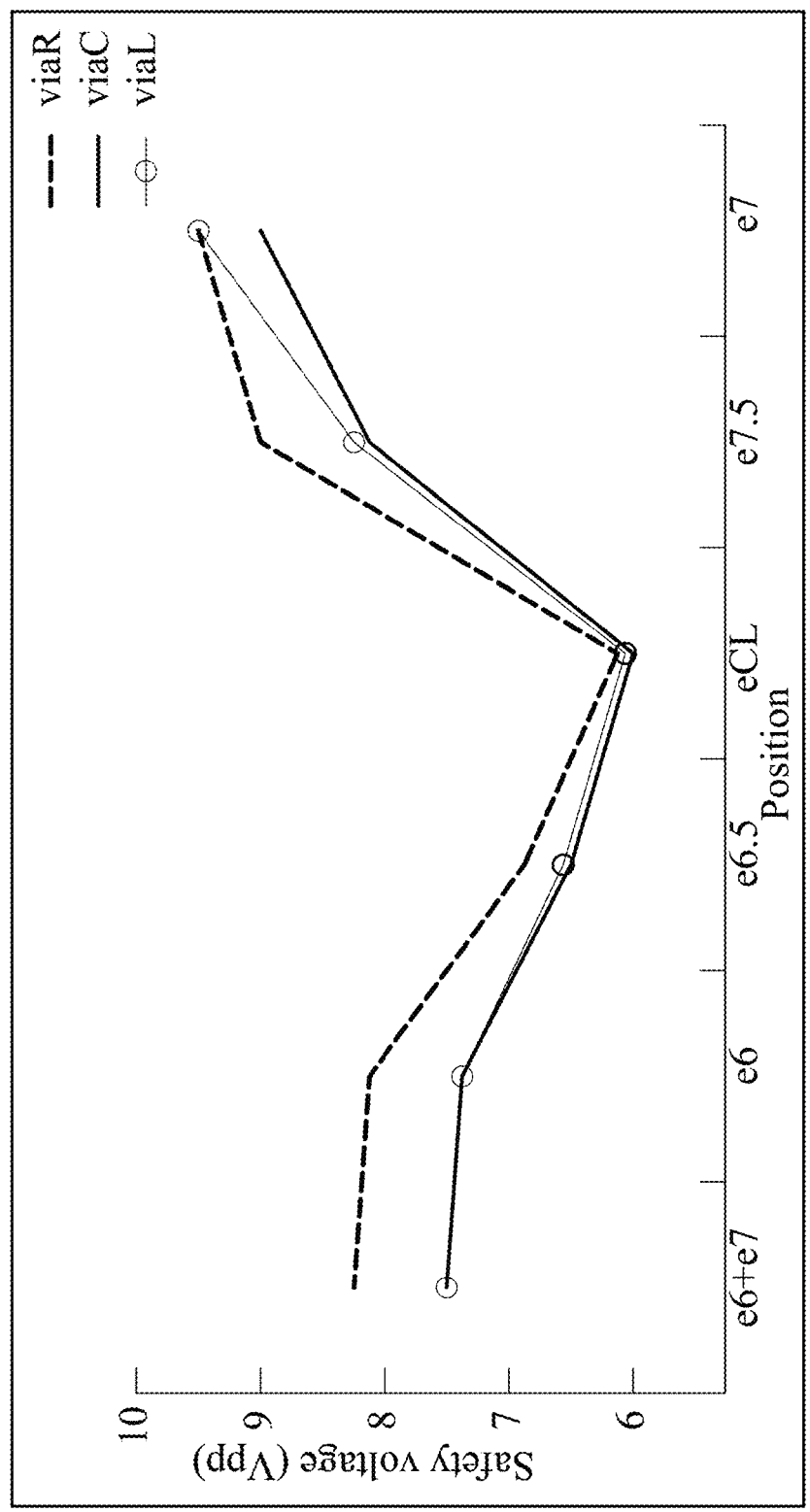
FIG. 8 is a diagram showing the relationship between the positions where the connecting portion and electrode via are disposed and the safety voltage in accordance with some embodiments of the present disclosure.

Next, refer to FIG. 8, which is a diagram showing the relationship between the positions where the connecting portion 130x and electrode via 130v are disposed and the safety voltage in accordance with some embodiments of the present disclosure. The line segments viaR, viaC, and viaL in FIG. 8 respectively represent the safety voltage changes of the embodiments when the connecting portion 130x is disposed at different positions (viaR: the electrode via 130v is disposed at the corner point adjacent to the seventh edge e7 (e.g., the configuration of the electrode via 130v shown in FIG. 6C); viaC: the electrode via 130v is disposed adjacent to the boundary between the sixth edge e6 and the seventh edge e7 (e.g., the configuration of the electrode via 130v shown in FIG. 6B); and viaL: the electrode via 130v is disposed at the corner point adjacent to the sixth edge e6 (e.g., the configuration of the electrode via 130v shown in FIG. 6A).

The X-coordinates in FIG. 8 represents the position where the connecting portion 130x is disposed. Specifically, "e6+e7" corresponds to the configuration of the connecting portions 130x shown in FIG. 7A. "e6" corresponds to the configuration of the connecting portion 130x shown in FIG. 4A. "e6.5" corresponds to the configuration of the connecting portion 130x shown in FIG. 7B. "eCL" corresponds to the configuration of the connecting portion 130x shown in any one of FIGS. 6A to 6C. "e7.5" corresponds to the configuration of the connecting portion 130x shown in FIG. 7C. "e7" corresponds to the configuration of the connecting portion 130x shown in FIG. 4C.

As shown in FIG. 8, the safety voltage change trends of the line segments viaR, viaC, and viaL when the connecting portion 130x is disposed at different positions are substantially similar. Therefore, it can be seen that the position where the electrode via 130v is disposed has less influence on the safety voltage. Furthermore, when the position of the connecting portion 130x is disposed at "e6.5" and "eCL", the safety voltage is lower. When the position of the connecting portion 130x is disposed at "e7.5" and "e7", the safety voltage is higher. That is, when the connecting portion 130x is disposed between the corner point of the seventh edge e7 and the center line CL of the main portion 130m, or when it is disposed at the corner point of the seventh edge e7, the safety voltage performance of the patterned electrode 130 is better.

In addition, it should be understood that, in accordance with the embodiments of the present disclosure, the definition regarding safety voltage is: when the driving voltage of the switch unit 300 is less than or equal to the safety voltage, the degree of abnormal scratching events (such as dark bands) generated by the external force scratching the panel is less noticeable by the observer. In other words, in this case, scratching the panel with external force does not cause abnormal scratching event. On the other hand, when the driving voltage of the switch unit 300 is greater than the safety voltage, scratching the panel with external force starts to produce abnormal events (such as dark bands). In other words, in accordance with the embodiments of the present disclosure, with the design of higher safety voltage, the abnormal scratching events can be reduced.

Moreover, in some embodiments, the panel 10A can be adjusted to the highest gray scale or the highest voltage, and then the abnormal scratching image can be generated on the panel 10A (where an external force can be used to scratch the panel 10A). The highest gray scale or the highest voltage of the display device 10 is then slowly decreased until the observer cannot observe the abnormal scratching image on the panel 10A, and the voltage when the above event is observed is defined as the safety voltage. In some embodiments, the highest gray scale of the panel 10A may be, for example, 255 gray scale or 20 Vpp, but the present disclosure is not limited thereto. It should be understood that, according to different products, the corresponding high voltage range may be different.

Figure 9:
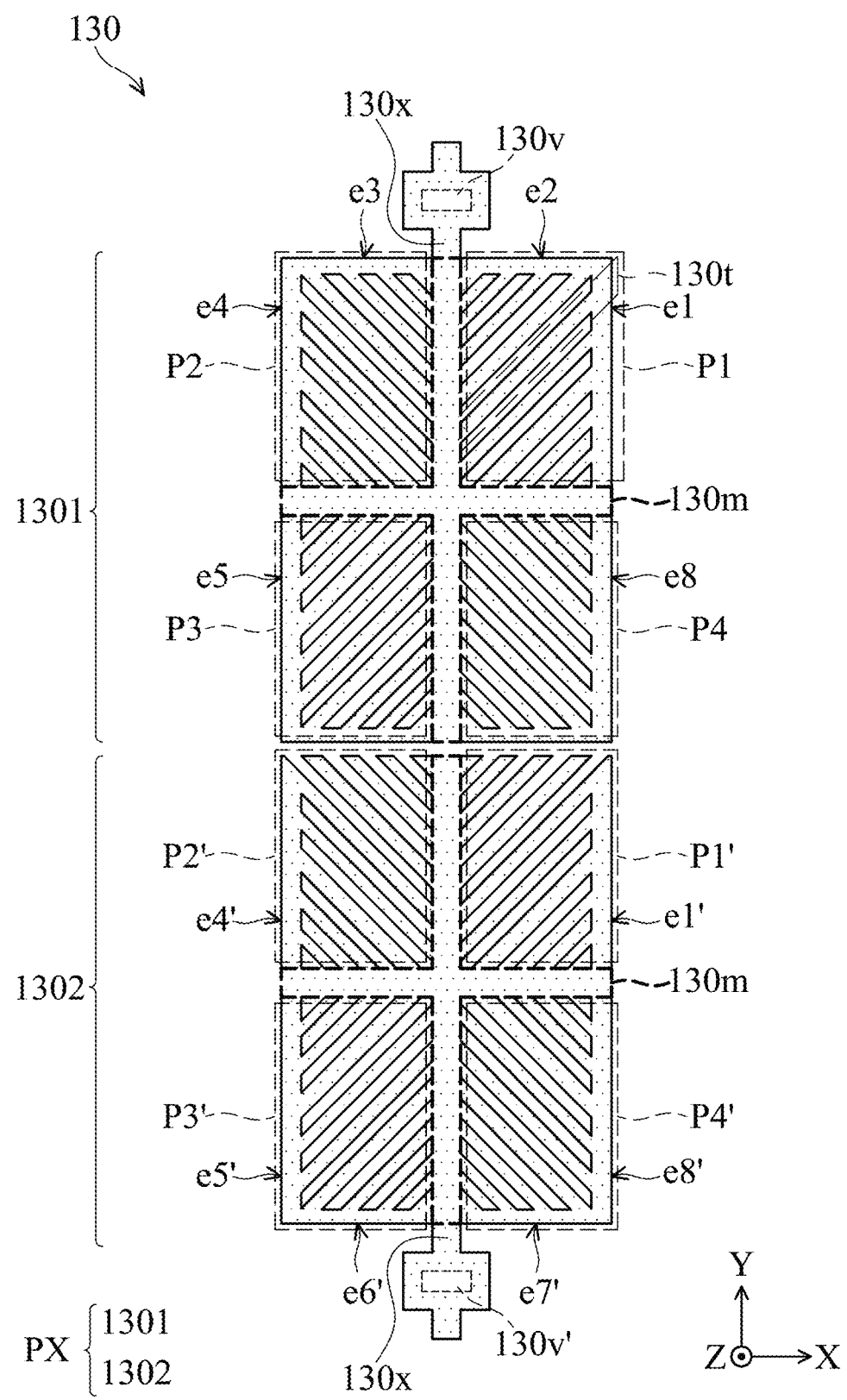
FIG. 9 is a partial top-view diagram of a display device in accordance with some embodiments of the present disclosure.

Next, refer to FIG. 9, which is a partial top-view diagram of the display device 10 in accordance with some other embodiments of the present disclosure. It should be understood that, for clarity of description, FIG. 9 only illustrates the patterned electrode 130, the connecting portion 130x, and the electrode via 130v, and other elements are omitted.

As shown in FIG. 9, in some embodiments, the patterned electrode 130 may include a first portion 1301 and a second portion 1302. The first portion 1301 and the second portion 1302 may each include the main portion 130m and a plurality of branch portions 130t, and the branch portions 130t are connected to the main portion 130m. Specifically, in some embodiments, the first portion 1301 of the patterned electrode 130 may include the sub-portion P1, the sub-portion P2, the sub-portion P3, and the sub-portion P4 that are arranged in a counterclockwise manner. In addition, the two edges of the sub-portion P1, the sub-portion P2, the sub-portion P3, and the sub-portion P4 are sequentially defined as the first edge e1, the second edge e2, the third edge e3, the fourth edge e4, the fifth edge e5, the sixth edge e6 (not labeled), the seventh edge e7 (not labeled), and the eighth edge e8. Furthermore, in some embodiments, the second portion 1302 of the patterned electrode 130 may also include a sub-portion P1', a sub-portion P2', a sub-portion P3', and a sub-portion P4' that are arranged in a counterclockwise manner. In addition, the two edges of the sub-portion P1', the sub-portion P2', the sub-portion P3', and the sub-portion P4' are sequentially defined as a first edge e1', a second edge e2' (not labeled), a third edge e3' (not labeled), a fourth edge e4', a fifth edge e5', a sixth edge e6', a seventh edge e7', and an eighth edge e8'. In some embodiments, the first portion 1301 and the second portion 1302 may be defined as a pixel unit PX.

In some embodiments, the first portion 1301 of the patterned electrode 130 may be electrically connected to the switch unit 300 (not illustrated) through the electrode via 130v. In addition, in some embodiments, the display device 10 may further include another switch unit 300 (not illustrated) and an electrode via 130v' disposed adjacent to the second portion 1302, and the another switch unit 300 may be electrically connected to the second portion 1302 through the electrode via 130v. In some embodiments, the voltages of the switch units 300 respectively electrically connected to the first portion 1301 and the second portion 1302 may be related in certain way or mutually adjusted, thereby improving the color shift problem of the panel in the side-view angle.

It should be understood that FIG. 9 only schematically illustrates the positions of the connecting portions 130x, and the positions of the connecting portion 130x may be disposed according to the rules described in the foregoing embodiments. For example, in some embodiments, the connecting portions 130x connected to the electrode via 130v and the electrode via 130v' may be respectively disposed on the third edge e3 of the first portion 1301 and the seventh edge e7' of the second portion 1302, so as to further improve the stability of the liquid crystal alignment.

Figure 10:
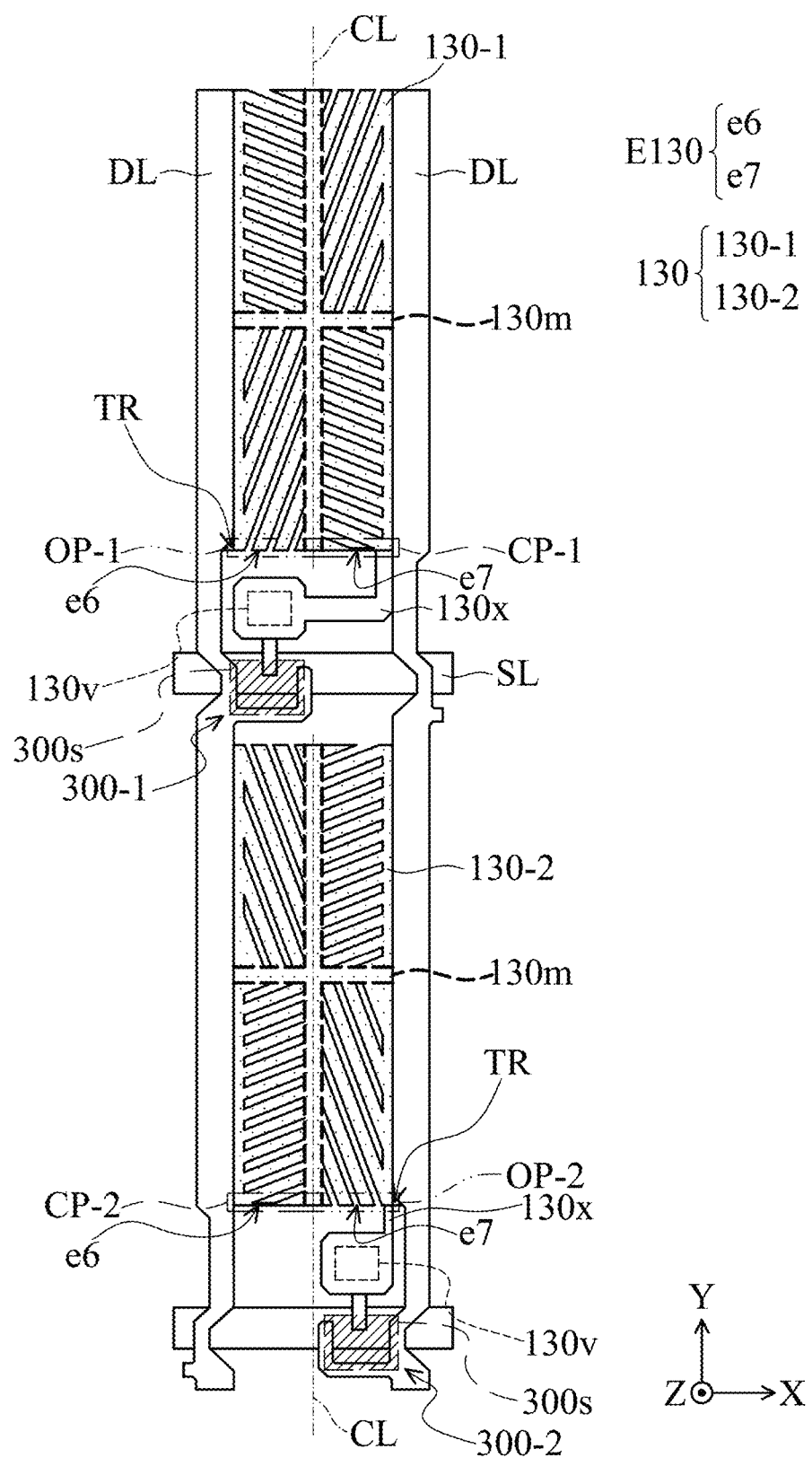
FIG. 10 is a partial top-view diagram of a display device in accordance with some embodiments of the present disclosure.
Figure 11:
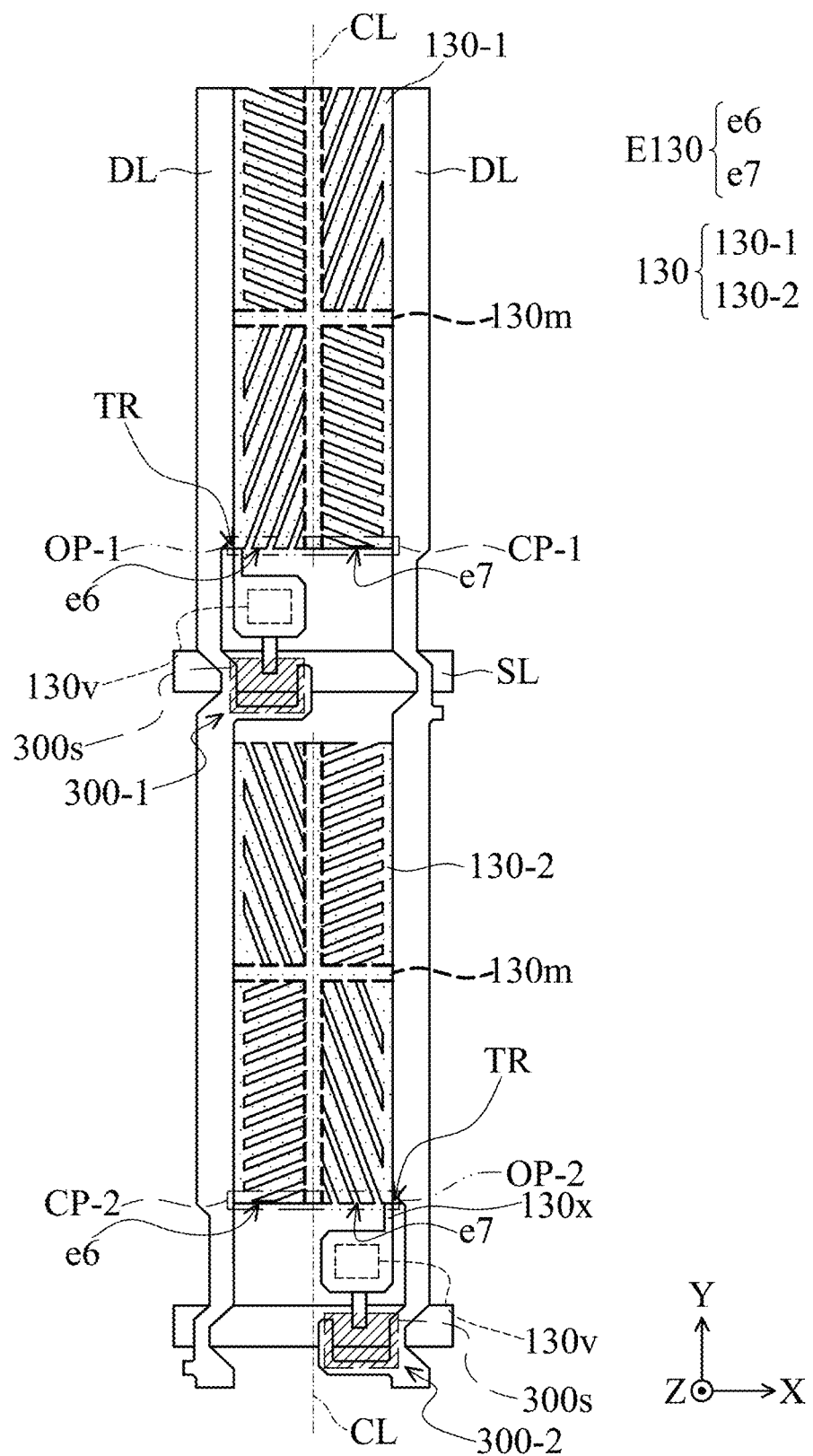
FIG. 11 is a partial top-view diagram of a display device in accordance with some embodiments of the present disclosure.

Next, refer to FIG. 10 and FIG. 11, which are partial top-view diagrams of the display device 10 in accordance with some other embodiments of the present disclosure. As shown in FIG. 10 and FIG. 11, in some embodiments, adjacent patterned electrodes 130 (e.g., adjacent patterned electrode 130-1 and patterned electrode 130-2) may be electrically connected to different data lines DL located on either side (opposite sides) of the patterned electrode 130 through the connecting portions 130x, respectively. Specifically, the adjacent patterned electrodes 130 may be respectively electrically connected to the data lines DL located on either side (opposite sides) of the patterned electrode 130 (e.g., the patterned electrode 130-1 and the patterned electrode 130-2) through the electrode vias 130v and the switch units 300 (e.g., the switch unit 300-1 and the switch unit 300-2).

As shown in FIG. 10, in some embodiments, the patterned electrode 130-1 may be disposed adjacent to the patterned electrode 130-2. In some embodiments, the edge E130 of the patterned electrode 130-1 may have an open area OP-1 and a closed area CP-1, and the edge E130 of the patterned electrode 130-2 may have an open area OP-2 and a closed area CP-2. In some embodiments, the open area OP-1 may be disposed adjacent to the closed area CP-1, and the open area OP-2 may be disposed adjacent to the closed area CP-2. More specifically, the open area OP-1 and the open area OP-2 may be located on either side of the extending line of the center line CL of the main portion 130m of the patterned electrode 130-1 respectively. As shown in FIG. 10, the open area OP-1 may be located on the left side of the center line CL, and the open area OP-2 may be located on the right side of the center line CL. In this embodiment, the patterned electrode 130-1 may extend the connecting portion 130x out from any position of the closed area CP-1 so that it may be electrically connected to the switch unit 300-1, and the patterned electrode 130-2 may extend another connecting portion 130x out from the terminal portion TR of the open area OP-2 so that it may be electrically connected to the switch unit 300-2. More specifically, the connecting portions 130x of the patterned electrode 130-1 and the patterned electrode 130-2 may be electrically connected to the data lines DL on opposite sides, respectively.

Furthermore, as shown in FIG. 11, in some embodiments, adjacent patterned electrodes 130 (e.g., adjacent patterned electrode 130-1 and patterned electrode 130-2) may be electrically connected to different data lines DL on either side (opposite sides) through the connecting portions 130x disposed on the sixth edge e6 and the seventh edge e7, respectively. In other words, the patterned electrode 130-1 may extend the connecting portion 130x out from the terminal portion TR of the open area OP-1, the connecting portion 130x of the patterned electrode 130-1 may be electrically connected to the switch unit 300-1, and electrically connected to the data line DL on one side through the switch unit 300-1. The patterned electrode 130-2 extend may extend the connecting portion 130x out from the terminal portion TR of the open area OP-2, the connecting portion 130x of the patterned electrode 130-2 may be electrically connected to the switch unit 300-2, and electrically connected to the data line DL on the other side through the switch unit 300-2. In some embodiments, adjacent patterned electrodes 130 are electrically connected to different data lines DL located on either side (opposite sides) of the patterned electrodes 130. Therefore, the signal crosstalk issue between adjacent data lines DL can be reduced.

To summarize the above, in some embodiments of the present disclosure, the chiral dopant may be added to the liquid-crystal layer and the connection position between the patterned electrode and the switch unit (e.g., the position of the connecting portion connecting the patterned electrode and the electrode via) may be adjusted. The liquid-crystal alignment stability of the display device thereby can be improved, or the issue of afterimage generated when the panel is scratched by an external force, which affects the display quality, can be reduced.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A display device, comprising:
a first substrate;
a second substrate disposed corresponding to the first substrate;
a backlight module, wherein the first substrate is disposed between the backlight module and the second substrate;
a patterned electrode disposed on the first substrate or the second substrate;
a switch unit disposed adjacent to the patterned electrode;
a liquid-crystal layer doped with a chiral dopant disposed between the first substrate and the second substrate; and
a connecting portion, wherein the patterned electrode is electrically connected to the switch unit by the connecting portion,
wherein an edge of the patterned electrode that is closest to the switch unit has an open area and a closed area, the open area is adjacent to the closed area, and the connecting portion extends from the closed area of the edge,
wherein when the patterned electrode is disposed on the first substrate, the chiral dopant is a left-handed chiral dopant, and
wherein when the patterned electrode is disposed on the second substrate, the chiral dopant is a right-handed chiral dopant.

2. The display device as claimed in claim 1, wherein the patterned electrode comprises a main portion and a plurality of branch portions, and the plurality of branch portions are connected to the main portion.

3. The display device as claimed in claim 2, wherein the open area and the closed area are located on either side of a center line of the main portion respectively.

4. The display device as claimed in claim 1, wherein the connecting portion extends from any position of the closed area toward the switch unit.

5. The display device as claimed in claim 1, wherein the patterned electrode comprises a main portion and a first sub-portion, a second sub-portion, a third sub-portion and a fourth sub-portion that are connected to the main portion, the first sub-portion, the second sub-portion, the third sub-portion and the fourth sub-portion are arranged in a counterclockwise manner, the first sub-portion, and the second sub-portion, the third sub-portion and the fourth sub-portion each comprises a plurality of branch portions, wherein a first included angle between one of the plurality of branch portions in the second sub-portion and the main portion is greater than a second included angle between one of the plurality of branch portions in the first sub-portion and the main portion, and wherein the connecting portion extends from the third sub-portion or the fourth sub-portion of the patterned electrode to electrically connect to the switch unit.

6. The display device as claimed in claim 5, wherein the first included angle is greater than or equal to 20 degrees and less than or equal to 90 degrees, and the second included angle is greater than or equal to 5 degrees and less than or equal to 60 degrees.

7. The display device as claimed in claim 1, further comprising an electrode via disposed adjacent to the patterned electrode, and the switch unit is electrically connected to the patterned electrode through the electrode via.

8. The display device as claimed in claim 7, wherein a portion of the connecting portion in contact with the patterned electrode extends along a first direction, a portion of the connecting portion in contact with the electrode via extends along a second direction, and the first direction is different from the second direction.

9. The display device as claimed in claim 8, wherein the first direction is perpendicular to the second direction.

10. The display device as claimed in claim 1, wherein the connecting portion has a width, and the width is in a range from 1 micrometer to 12 micrometers.

11. A display device, comprising:
a first substrate;
a second substrate disposed corresponding to the first substrate;
a backlight module, wherein the first substrate is disposed between the backlight module and the second substrate;
a first patterned electrode disposed on the first substrate or the second substrate;
a first switch unit disposed adjacent to the first patterned electrode;
a liquid-crystal layer doped with a chiral dopant disposed between the first substrate and the second substrate; and
a connecting portion, wherein the first patterned electrode is electrically connected to the switch unit by the connecting portion,
wherein an edge of the first patterned electrode that is closest to the first switch unit has a first open area and a first closed area, the first open area is adjacent to the first closed area, and the connecting portion extends from the first open area of the edge,
wherein when the first patterned electrode is disposed on the first substrate, the chiral dopant is a left-handed chiral dopant, and
wherein when the first patterned electrode is disposed on the second substrate, the chiral dopant is a right-handed chiral dopant.

12. The display device as claimed in claim 11, wherein the first patterned electrode comprises a first main portion and a plurality of first branch portions, the plurality of first branch portions are connected to the first main portion, part of the plurality of first branch portions are located in the first open area, the part of the plurality of first branch portions that is farthest from the first closed area has a first terminal portion, and the first patterned electrode extends the extending portion out from the first terminal portion.

13. The display device as claimed in claim 12, further comprising:
a second patterned electrode disposed adjacent to the first patterned electrode; and
a second switch unit disposed adjacent to the second patterned electrode;
wherein an edge of the second patterned electrode that is closest to the second switch unit has a second open area and a second closed area, the second open area is adjacent to the second closed area, and the second patterned electrode extends another connecting portion out from the second open area and the another connecting portion is electrically connected to the second switch unit.

14. The display device as claimed in claim 13, wherein the second patterned electrode comprises a second main portion and a plurality of second branch portions, the plurality of second branch portions are connected to the second main portion, part of the plurality of second branch portions are located in the second open area, the part of the plurality of second branch portions that is farthest from the second closed area has a second terminal portion, and the second patterned electrode extends another connecting portion out from the second terminal portion and the another connecting portion is electrically connected to the second switch unit.

15. The display device as claimed in claim 13, wherein the first open area and the second open area are located on either side of an extending line of a center line of the first main portion respectively.

16. The display device as claimed in claim 13, further comprising a plurality of data lines and a plurality of scan lines disposed on the first substrate or the second substrate, the first patterned electrode and the second patterned electrode are electrically connected to different data lines located on either side of the first patterned electrode and the second patterned electrode, respectively.

17. The display device as claimed in claim 11, wherein the first patterned electrode comprises a main portion and a first sub-portion, a second sub-portion, a third sub-portion and a fourth sub-portion that are connected to the main portion, the first sub-portion, the second sub-portion, the third sub-portion and the fourth sub-portion are arranged in a counterclockwise manner, the first sub-portion, and the second sub-portion, the third sub-portion and the fourth sub-portion each comprises a plurality of branch portions, wherein a first included angle between one of the plurality of branch portions in the second sub-portion and the main portion is greater than a second included angle between one of the plurality of branch portions in the first sub-portion and the main portion, and wherein the connecting portion extends from the third sub-portion or the fourth sub-portion of the patterned electrode to electrically connect to the switch unit.

18. The display device as claimed in claim 5, wherein the connecting portion extends from the fourth sub-portion of the patterned electrode to electrically connect to the switch unit, and the fourth sub-portion is in the closed area.

19. The display device as claimed in claim 17, wherein the connecting portion extends from the third sub-portion of the patterned electrode to electrically connect to the switch unit, and the third sub-portion is in the open area.

* * * * *